(12) United States Patent
Sachdev et al.

(10) Patent No.: US 6,369,631 B1
(45) Date of Patent: Apr. 9, 2002

(54) HIGH PERFORMANCE IMPULSE FLIP-FLOPS

(75) Inventors: Manoj Sachdev, Waterloo; Siva Narendra, Beaverton, both of (CA)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/608,687

(22) Filed: Jun. 29, 2000

(51) Int. Cl.[7] ............................................. H03K 3/356
(52) U.S. Cl. ........................ 327/211; 327/212; 327/218
(58) Field of Search ................................ 327/199, 201, 327/208–215, 218; 326/95–98, 112, 114, 119, 121, 122

(56) References Cited

U.S. PATENT DOCUMENTS

| | | | |
|---|---|---|---|
| 5,459,421 A | 10/1995 | Shaw | 327/203 |
| 5,557,225 A | 9/1996 | Denham et al. | 327/199 |
| 5,656,962 A | 8/1997 | Banik | 327/202 |
| 5,764,089 A * | 6/1998 | Partovi et al. | 327/200 |
| 5,774,005 A * | 6/1998 | Partovi et al. | 327/218 |
| 5,867,049 A * | 2/1999 | Mohd | 327/218 |
| 5,917,355 A * | 6/1999 | Klass | 327/218 |
| 6,002,285 A * | 12/1999 | Muhich et al. | 327/218 |
| 6,181,180 B1 * | 1/2001 | Chen et al. | 327/211 |

OTHER PUBLICATIONS

Hamid Partovi, et al. "Flow–Through Latch and Edge–Triggered Flip–Flop Hybrid Elements", ISSCC96/Session 8/Digital Clocks and Latches/Paper FA 8.5, 1996IEEE Internaional Solid–State Circuits Conference, 2 Pgs.

* cited by examiner

Primary Examiner—Toan Tran
(74) Attorney, Agent, or Firm—Blakely, Sokoloff, Taylor & Zafman LLP

(57) ABSTRACT

A flip-flop circuit uses a multiple input conditional inverter activated by clock signals to transfer a sample of the input data to a keeper circuit. The keeper circuit signal is buffered to provide the flip-flop circuit output.

21 Claims, 4 Drawing Sheets

HIGH PERFORMANCE IMPULSE FLIP-FLOPS

FIELD OF THE INVENTION

The present invention pertains to the field of electronic circuits. More particularly, the present invention relates to the design of flip-flop circuitry.

BACKGROUND OF THE INVENTION

Flip-flop circuits are used to maintain an output state (Q) based upon the sampling of an input data signal (D) at a particular point in time determined by a clock signal (CLK). The sampling of the input data signal is activated either by the edge or the level of the clock signal. At all other times, the output of the flip-flop circuit will not respond to changes in the input data signal.

Typical flip-flops have shortcomings. One such typical flip-flop is the master-slave flip-flop, which consists of two stages, the master and the slave. To change the output of the master-slave flip-flop, a signal must propagate through both the master and the slave stages. In fast circuits, this delay can pose problems.

Additionally, the number of logic devices used to build both the master and the slave can be large. This large number of devices may consume more power than desirable.

Also, the master-slave flip-flop requires that the data input be present and stable for a given time before the clock activates the sampling for the flip-flop to accurately respond to the data input. This is called the data "setup" time. Setup time affects the speed at which a flip-flop may operate. Thus, a setup time may pose a problem.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A method and apparatus for a flip-flop are described. The invention has a clock-to-output delay of two inverters in one embodiment. In another embodiment the clock-to-output delay is an inverter and a pass transistor. Because of the reduced clock-to-output delay, the flip-flops are extremely fast. The flip-flops do not require any setup time. The output of the flip-flops is also buffered. This buffering isolates the keeper circuit from the load. The flip-flops require fewer transistors than conventional flip-flop implementations, so may be smaller in size and/or consume less power.

Figure 1:
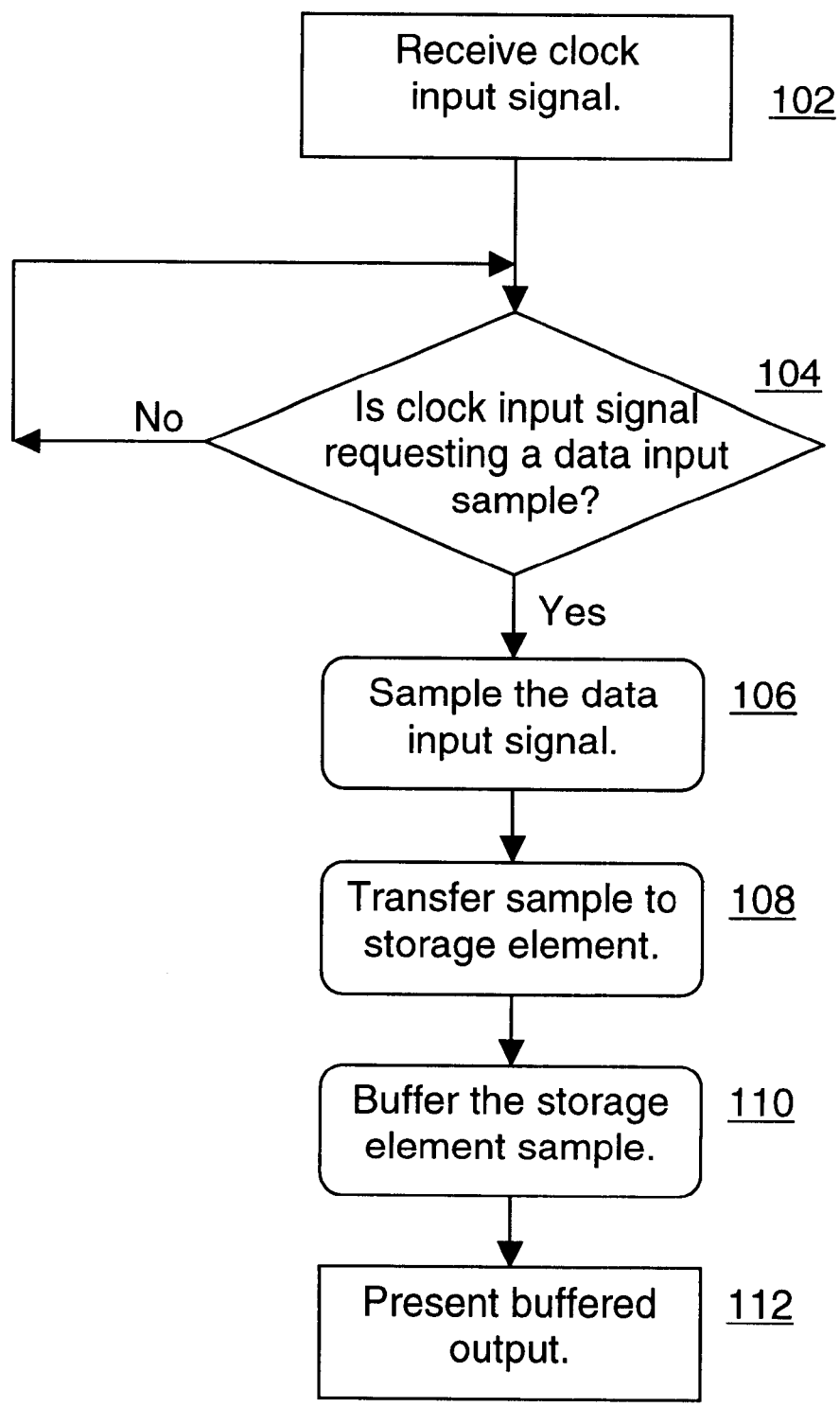
FIG. 1 is a block diagram of a flip-flop.

FIG. 1 is a block diagram of a flip-flop. An input signal in the form of a clock is received 102. The clock input signal is next checked to determine if it is requesting a data input sample 104. If the input clock signal is not requesting a data input sample, then the input clock signal is checked again at 104. If the input clock signal is requesting a data input sample, then the data input signal is sampled 106. After the data input signal is sampled 106, the data input signal sample is transferred to a storage element 108. The storage element, representing the data input signal sample, is then buffered 110, and the buffered signal is presented as the output 112.

Figure 2:
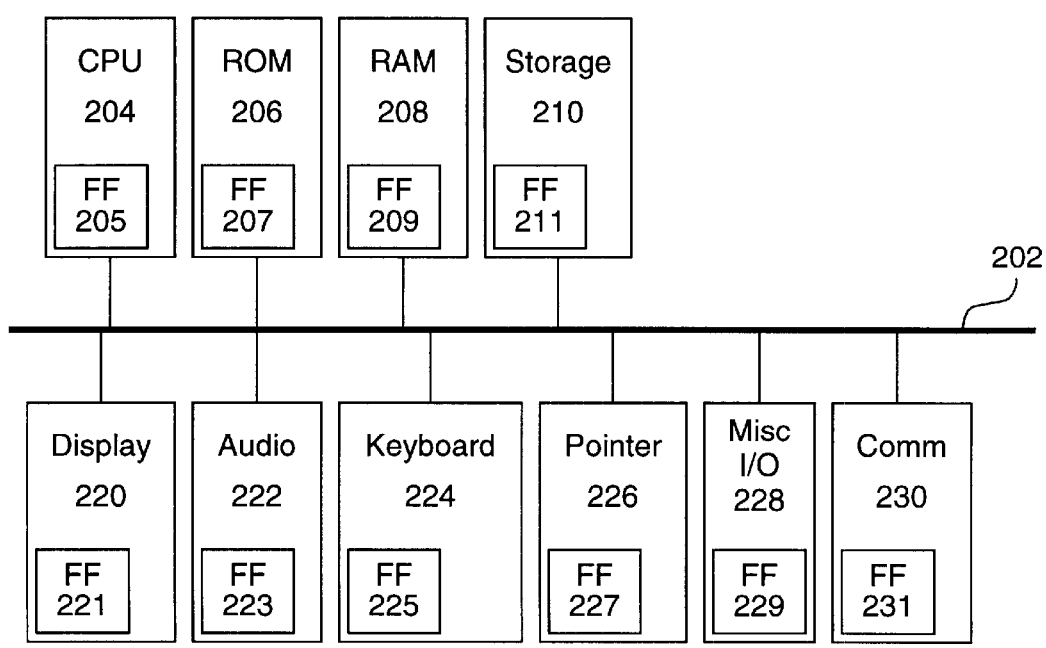
FIG. 2 is a block diagram of a computer system.

FIG. 2 is a block diagram of a computer system. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), etc. The CPU 204 may be a single, multiple, or even a distributed computing resource. The ROM 206 may be any type of non-volatile memory, which may be programmable such as, mask programmable, flash, etc. RAM 208 may be, for example, static, dynamic, synchronous, asynchronous, or any combination. Storage 210, may be Compact Disc (CD), Digital Versatile Disk (DVD), hard disks, optical disks, tape, flash, memory sticks, video recorders, etc. Display 220 might be, for example, a Cathode Ray Tube (CRT), Liquid Crystal Display (LCD), a projection system, Television (TV), etc. Audio 222 may be a monophonic, stereo, three dimensional sound card, etc. The keyboard 224 may be a keyboard, a musical keyboard, a keypad, a series of switches, etc. The pointer 226, may be, for example, a mouse, a touchpad, a trackball, joystick, etc. I/O devices 228, might be a voice command input device, a thumbprint input device, a smart card slot, a Personal Computer Card (PC Card) interface, virtual reality accessories, etc., which may optionally connect via an input/output port 229 to other devices or systems. An example of a miscellaneous I/O device 228 would be a Musical Instrument Digital Interface (MIDI) card. Communications device 230 might be, for example, an Ethernet adapter for local area network (LAN) connections, a satellite connection, a settop box adapter, a Digital Subscriber Line (xDSL) adapter, a wireless modem, a conventional telephone modem, a direct telephone connection, a Hybrid-Fiber Coax (HFC) connection, cable modem, etc. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

The present invention is capable of being embodied in each of the blocks of the computer system described above. Flip-flop 205 in the CPU 204 may be used to store the results of processing. Flip-flop 205 may be used to latch the signals received from the bus system 202. A flip-flop 207 used in ROM 206, may store the results of an access for presentation as an output on bus system 202. Likewise, the ROM 206 may embody the flip-flop 207 to latch an address that the bus system 202 presents to the ROM 206. A flip-flop 209 used in RAM 208, may store the results of an access for presentation as an output on bus system 202. RAM 208 may embody the flip-flop 209 to latch an address that the bus system 202 presents to the RAM 208. The RAM 208 may also use a flip-flop 209 as a storage element for either main storage, or cache storage. Storage 210 may for example, embody a flip-flop 211, as an output storage device to present its output to the bus 202. Flip-flop 211 may also store such things as user options for operation of the storage 210 which are received from the bus 202. Display 220 might use flip-flop 221 to latch a display signal, for example, if display 220 is an LCD display, flip-flop 221 might be used in an active-matrix as the storage element for a pixel. If display 220 is a CRT, flip-flop 221, might be used to store correction parameters, such as pin cushion correction. Audio 222 may use flip-flop 223 to store input and/or output signals received/sent to bus system 202. The keyboard 224 may use flip-flop 225 to store the status of indicators such as the numeric lock, caps lock, scroll lock, etc. The pointer 226, for example as a mouse, may use flip-flop 227 to store the status of a user click. An I/O device 228, for example in a thumbprint input device, may use flip-flop 229 to store the results of a thumbprint scan. Communications device 230 might be, for example, an Ethernet adapter which may use flip-flop 231 to store the results of a received packet.

Figure 3:
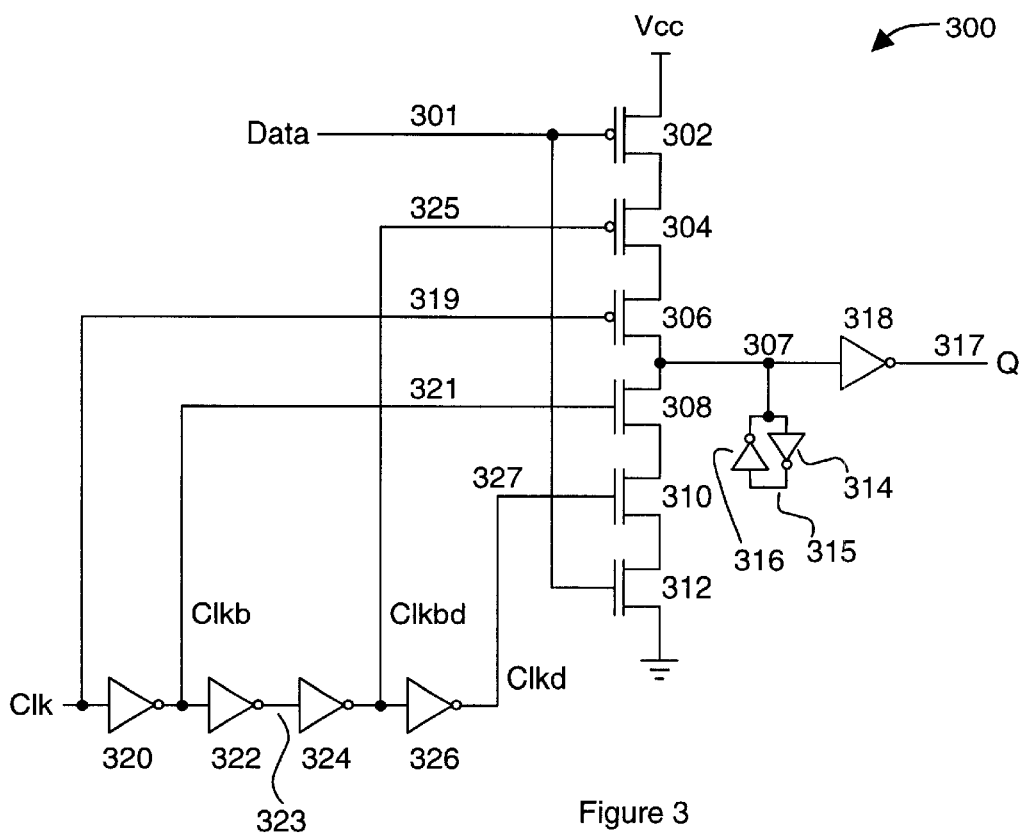
FIG. 3 is a circuit diagram of an embodiment of a flip-flop.

FIG. 3 is a circuit diagram of an embodiment of a flip-flop. Flip-flop 300, has a Data input 301 to receive data. The Data input 301 is connected to the gate of a P-type transistor 302 and the gate of an N-type transistor 312. The source of transistor 302 is connected to a positive power supply Vcc. The source of transistor 312 is connected to a less positive power supply than Vcc, designated as ground by the ground symbol. The drain of transistor 302 is connected to the source of a P-type transistor 304. The drain of transistor 304 is connected to the source of a P-type transistor 306. The drain of transistor 306 is connected to the drain of a N-type transistor 308. The source of transistor 308 is connected to the drain of a N-type transistor 310. The source of transistor 310 it connected to the drain of transistor 312. Flip-flop 300, has a clock input 319, denoted Clk, to receive a clock. The Clk input 319 is connected to the input of an inverter 320, and the gate of transistor 306. The output of inverter 320 is denoted as Clkb 321, and is connected to the input of inverter 322, and the gate of transistor 308. The output of inverter 322, denoted 323, is coupled to the input of inverter 324. The output of inverter 324, denoted Clkbd 325, is coupled to the input of inverter 326, and the gate of transistor 304. The output of inverter 326, denoted Clkd 327, id coupled to the gate of transistor 310. The drain of transistor 306 and the drain of transistor 308 are coupled to the node 307. Node 307 is coupled to the input of inverter 314. The output of inverter 314, denoted as 315, is coupled to the input of inverter 316. The output of inverter 316 is coupled to the input of inverter 314. The node 307 is coupled to the input of the inverter 318. The output of inverter 318, denoted as Q 317, is the output of the flip-flop 300.

Figure 4:
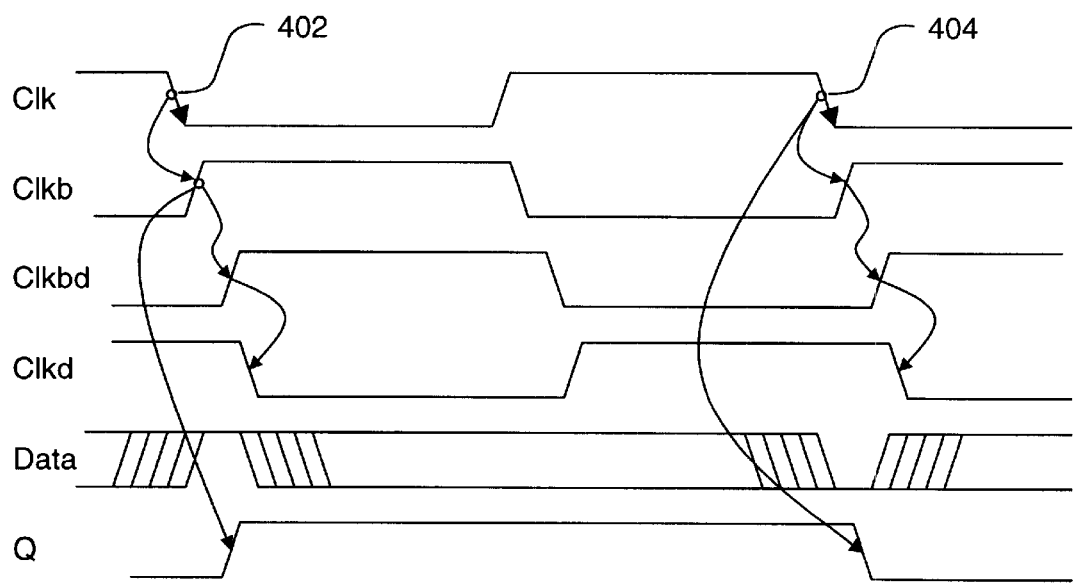
FIG. 4 is a waveform diagram illustrating the operation of the circuit depicted in FIG. 3.

FIG. 4 is a waveform diagram illustrating the operation of the circuit depicted in FIG. 3. Operation is illustrated for the flip-flop 300 when the Data is in a binary high state at the sequence labeled 402, and operation is illustrated for the flip-flop 300 when the Data is in a binary low state at the sequence labeled 404.

Sequence 402 begins when the Clk signal makes a high to low transition. This Clk high to low transition propagates through the flip-flop circuitry and causes the Clkb low to high transition, the Clkbd low to high transition, the Clkd high to low transition. The Clkb transition from low to high "samples" the Data, which in this example, is in a high state, the result is that the output Q is in a high state.

Sequence 404 begins when the Clk signal makes a high to low transition. This Clk high to low transition propagates through the flip-flop circuitry and causes the Clkb low to high transition, the Clkbd low to high transition, the Clkd high to low transition. The Clk transition from high to low "samples" the Data, which in this example, is in a low state, the result is that the output Q is in a high low.

Operation of the flip-flop 300 may be more easily understood by considering transistors 302, 304, 306, 308, 310, and 312 as a "gated" inverter. When the inverter is "active," a signal, dependent on the state of Data 301, will be transferred at the "gated" output junction of 306 and 308, denoted as node 307. The signal at node 307 will be "kept" by the keeper circuit of 314 and 316, and the signal at node 307 will be buffered by inverter 318 and output as Q 317. When the "gated" inverter is not active, that is, it is no longer actively driving the node 307 and has entered a high impedance (Hi-Z) state, then the output Q 317 will be maintained because the keeper circuit has maintained the state when the "gated" inverter was actively driving node 307.

The "gated" inverter is actively driving node 307 toward a high state when the gates of transistors 302, 304, and 306, corresponding to the signals Data 301, Clkbd 325 and Clk 319 respectively, are in a low state. Conversely, the "gated" inverter is actively driving node 307 toward a low state when the gates of transistors 308, 310, and 312, corresponding to the signals Clkb 321, Clkd 327, and Data 301 respectively, are in a high state.

Figure 5:
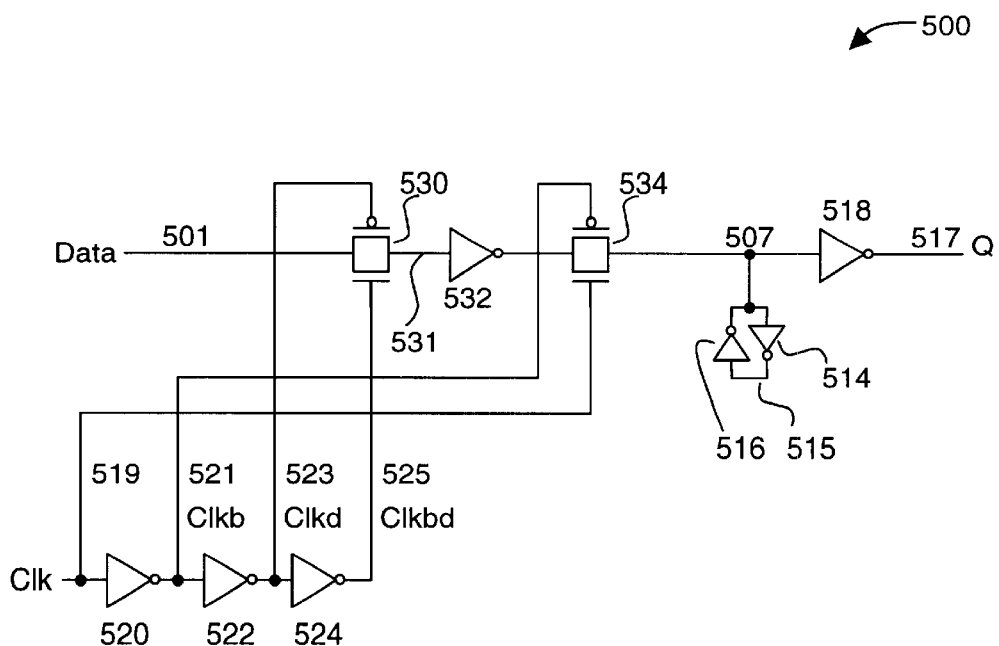
FIG. 5 is a circuit diagram of another embodiment of a flip-flop.

FIG. 5 is a circuit diagram of another embodiment of a flip-flop. Flip-flop 500, has a Data input 501 to receive data. The Data input 501 is connected to the input of a transmission gate 530. The output of transmission gate 530, denoted by node 531, is connected to the input of inverter 532. The output of inverter 532, is connected to the input of transmission gate 534. The output of transmission gate 534 is coupled to the node 507. Node 507 is coupled to the input of inverter 514. The output of inverter 514, denoted as 515, is coupled to the input of inverter 516. The output of inverter 516 is coupled to the input of inverter 514. The node 507 is coupled to the input of the inverter 518. The output of inverter 518, denoted as Q 517, is the output of the flip-flop 500. Flip-flop 500, has a clock input 519, denoted Clk, to receive a clock. The Clk input 519 is connected to the input of an inverter 520, and the N-type transistor control gate of transmission gate 534. The output of inverter 520 is denoted as Clkb 521, and is connected to the input of inverter 522, and the P-type transistor control gate of transmission gate 534. The output of inverter 522, denoted Clkd 523, is coupled to the P-type transistor control gate of transmission gate 530. The output of inverter 524, denoted Clkbd 525, is coupled to the N-type transistor control gate of transmission gate 530.

Figure 6:
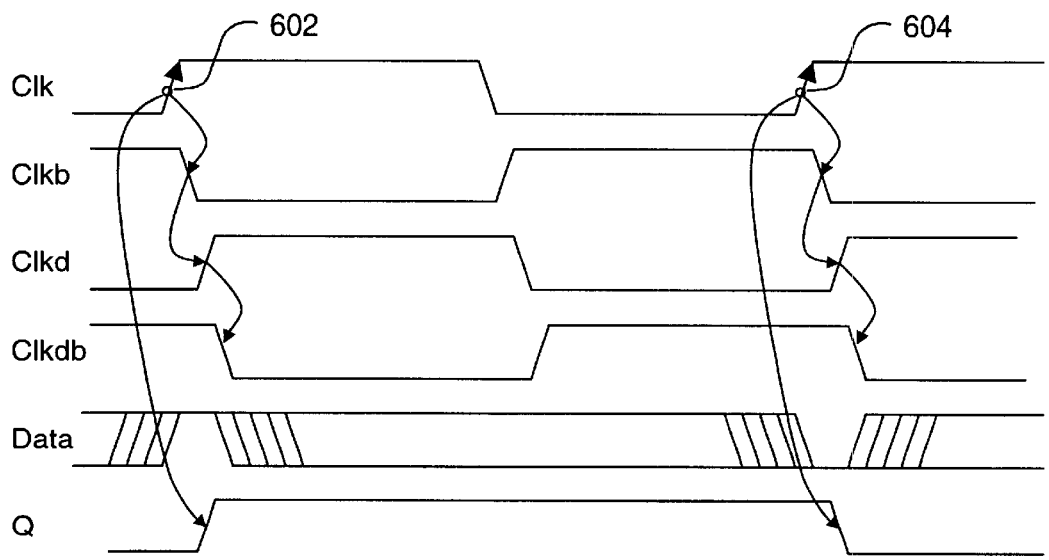
FIG. 6 is a waveform diagram illustrating the operation of the circuit depicted in FIG. 5.

FIG. 6 is a waveform diagram illustrating the operation of the circuit depicted in FIG. 5. Operation is illustrated for the flip-flop 500 when the Data is in a binary high state at the sequence labeled 602, and operation is illustrated for the flip-flop 500 when the Data is in a binary low state at the sequence labeled 604.

Sequence 602 begins when the Clk signal makes a low to high transition. This Clk low to high transition propagates through the flip-flop circuitry and causes the Clkb high to low transition, the Clkd low to high transition, the Clkdb high to low transition. The Clk transition from low to high "samples" the Data, which in this example, is in a high state, the result is that the output Q is in a high state.

Sequence 604 begins when the Clk signal makes a low to high transition. This Clk low to high transition propagates through the flip-flop circuitry and causes the Clkb high to low transition, the Clkd low to high transition, the Clkdb high to low transition. The Clk transition from low to high "samples" the Data, which in this example, is in a low state, the result is that the output Q is in a high low.

Operation of the flip-flop 500 may be more easily understood by considering transmission gates 530 and 534 as sequentially "allowing" the Data input 501 signal to pass to inverter 532 and then onto node 507. As used in this discussion, a transmission gate is considered to be "on" then the transmission gate has a low impedance between the input and output terminals of the transmission gate. Conversely, the transmission gate is considered "off" when there is a high impedance between the input and the output terminals of the transmission gate. The Data input signal 501 will propagate to the input of inverter 532, denoted as node 531, when the transmission gate 530 is on. The signal from the output of inverter 532 will propagate to node 507 when transmission gate 534 is on. The timing of when transmission gates 530 and 534 are on and off may be determined by the control gate signals Clk, Clkb, Clkd, and Clkbd as illustrated in FIG. 6.

In instances where flip-flop 500 may be operated with a low speed clock signal (Clk) or where the clock signal (Clk) may be stopped or paused, it may be desirable to place a keeper circuit attached to node 531. Such a keeper circuit may be one as is illustrated by the inverter 514, node 515, inverter 516, and connection to node 507. The purpose of such a keeper circuit attached to node 531 would be to maintain the signal transferred when transmission gate 530 was on but is now off.

Thus, a method and apparatus for flip-flop have been described. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A flip-flop circuit comprising:
   a data signal input to receive a data signal;
   a clock signal input to receive a clock signal;
   a clocking circuit coupled to receive the clock input and to generate control clocks;
   a multiple input conditional inverter to receive the data signal and control clocks, and to generate an output, wherein the data signal is coupled to a first logic device coupled directly to a first power supply and a second logic device coupled directly to a second power supply;
   a keeper circuit to receive the output of the multiple input conditional inverter; and
   a buffer circuit to receive the output of the multiple input conditional inverter and to generate the flip-flop circuit output.

2. The flip-flop circuit according to claim 1, wherein the multiple input conditional inverter further receives the clock signal.

3. A flip-flop circuit comprising:
   a first transistor, the first transistor having a control terminal, an input terminal, and an output terminal, wherein the control terminal is coupled to receive an data input signal and the input terminal is coupled to a positive supply voltage;
   a second transistor, the second transistor having a control terminal, an input terminal, and an output terminal, wherein the control terminal is coupled to receive a third clock signal and the input terminal is coupled to the output terminal of the first transistor;
   a third transistor, the third transistor having a control terminal, an input terminal, and an output terminal, wherein the control terminal is coupled to receive a first clock signal and the input terminal is coupled to the output terminal of the second transistor;
   a fourth transistor, the fourth transistor having a control terminal, an input terminal, and an output terminal, wherein the control terminal is coupled to receive a second clock signal and the output terminal is coupled to the output terminal of the third transistor;
   a fifth transistor, the fifth transistor having a control terminal, an input terminal, and an output terminal, wherein the control terminal is coupled to receive a fourth clock signal and the output terminal is coupled to the input terminal of the fourth transistor;
   a sixth transistor, the sixth transistor having a control terminal, an input terminal, and an output terminal, wherein the control terminal is coupled to receive the input data signal, the output terminal is coupled to the input terminal of the fifth transistor, and input terminal is coupled to a supply voltage less positive than the positive supply voltage;
   a first inverter, the first inverter having an input and an output, wherein the input is coupled to receive the first clock signal;
   a second inverter, the second inverter having an input and an output, wherein the input is coupled to the output terminal of the first inverter to receive the second clock signal;
   a third inverter, the third inverter having an input and an output, wherein the input is coupled to the output terminal of the second inverter;
   a fourth inverter, the fourth inverter having an input and an output, wherein the input is coupled to the output terminal of the third inverter to receive the third clock signal, and the output is coupled to the fourth clock;
   a keeper circuit, the keeper circuit having an input and output, wherein the input and output are coupled to the output terminal of the third transistor; and
   a buffer, the buffer having an input and an output, wherein the buffer input is coupled to the output terminal of the third transistor, and the buffer output is the flip-flop latched output signal.

4. The flip-flop according to claim 3, wherein the first clock signal is the flip-flop clock input signal.

5. The flip-flop according to claim 3, wherein the buffer output has the inverse digital polarity of the data input signal.

6. The flip-flop according to claim 3, wherein the buffer is an inverter and the inverter output has the same digital polarity as the data input signal.

7. The flip-flop according to claim 3, wherein the supply voltage less positive than the positive supply voltage is substantially electrical ground.

8. A processing system comprising a processing element and the flip-flop circuit of claim 3.

9. The processing system according to claim 8, wherein the flip-flop and the processing element are fabricated on an integrated circuit.

10. A machine readable medium that stores data representing the flip-flop circuit of claim 3.

11. A method for latching an input signal, comprising:
   receiving the input signal on a first logic device coupled directly to a first power supply and a second logic device coupled directly to a second power supply;
   receiving a clock signal;
   generating a first single delayed inversion of the clock signal;
   generating a second triple delayed inversion of the clock signal;
   generating a third fourth delayed version of the clock signal;
   sampling the input signal by using the clock signal, the first, the second, and the third delayed clock signal;
   transferring the sample of the input signal to a keeper circuit upon receiving the clock signal; and
   buffering the keeper circuit to generate the latched input signal.

12. The method according to claim 11, wherein transferring the sample of the input signal comprises:
   coupling the input signal to the keeper circuit; and
   disconnecting the input signal from the keeper circuit.

13. The method according to claim 12, wherein the coupling and disconnecting of the input signal to/from the keeper circuit is self-timed.

14. An apparatus for latching an input signal, comprising:
   means for receiving the input signal;
   means for receiving a clock signal;
   means for generating a first single delayed inversion of the clock signal;
   means for generating a second triple delayed inversion of the clock signal;
   means for generating a third fourth delayed version of the clock signal;
   means for coupling the input signal to a first logic device coupled directly to a first power supply and to a second logic device coupled directly to a second power supply
   means for sampling the input signal by using the clock signal, the first, the second, and the third delayed clock signal;
   means for transferring the sample of the input signal to a keeper circuit upon receiving the clock signal; and
   means for buffering the keeper circuit to generate the latched input signal.

15. The apparatus according to claim 14, wherein means for transferring the sample of the input signal comprises:
   means for substantially coupling the input signal to the keeper circuit; and
   means for substantially disconnecting the input signal from the keeper circuit.

16. The apparatus according to claim 15, wherein the means for substantially coupling and disconnecting of the input signal to/from the keeper circuit is a self-timed means.

17. A machine-readable medium having stored thereon instructions, which when executed by a processor, causes a logic block to perform the following:
   receive an input signal;
   receive a clock signal;
   generate a first single delayed inversion of the clock signal;
   generate a second triple delayed inversion of the clock signal;
   generate a third fourth delayed version of the clock signal;
   present the input signal to a first logic device couple directly to a first power supply and to a second logic device couple directly to a second power supply
   sample the input signal using the clock signal, the first, the second, and the third delayed clock signal;
   transfer the sample of the input signal to a keeper circuit upon receiving the clock signal; and
   buffer the keeper circuit to generate a latched output representation of the input signal.

18. The machine-readable medium according to claim 17, wherein transferring the sample of the input signal comprises:
   coupling the input signal to the keeper circuit; and
   disconnecting the input signal from the keeper circuit.

19. The machine-readable medium according to claim 18, wherein the coupling and disconnecting of the input signal to/from the keeper circuit is self-timed.

20. A flip-flop circuit comprising:
   a data signal input coupled to receive a data signal;
   a clock signal input coupled to receive a clock signal;
   a clocking circuit having an input coupled to receive the clock signal input and generating a plurality of control clock outputs,
   a multiple input conditional inverter having a plurality of inputs and an output, wherein a plurality of N-type devices are wired in series and connected to a plurality of P-type devices wired in series, wherein the node at the junction between the N-type and the P-type series connection is the output, and wherein a first N-type device in the plurality of N-type devices is coupled directly to a negative power supply, a first P-type device in the plurality of P-type devices is coupled directly to a positive power supply, and wherein the first N-type and first P-type device are coupled to receive the data input, and the remaining plurality of N-type and P-type devices are coupled to receive the control clock outputs,
   a keeper circuit to receive the output of the multiple input conditional inverter; and
   a buffer circuit to receive the output of the multiple input conditional inverter and to generate the flip-flop circuit output.

21. The flip-flop circuit according to claim 20, wherein the plurality of N-type devices is equal in number to the plurality of P-type devices and the number is greater than two.

* * * * *

UNITED STATES PATENT AND TRADEMARK OFFICE
CERTIFICATE OF CORRECTION

PATENT NO. : 6,369,631 B1
DATED : April 9, 2002
INVENTOR(S) : Sachdev et al.

It is certified that error appears in the above-identified patent and that said Letters Patent is hereby corrected as shown below:

<u>Title page,</u>
Item [75], delete "Manoj Sachdev, Waterloo; Siva Narendra, Beaverton, both of (CA)" and replace with -- Manoj Sachdev, Waterloo, Canada; Siva Narendra, Beaverton, OR --

Signed and Sealed this

Seventeenth Day of September, 2002

*Attest:*

*Attesting Officer*

JAMES E. ROGAN
*Director of the United States Patent and Trademark Office*